United States Patent [19]

Tsuji et al.

[11] Patent Number: 5,017,738

[45] Date of Patent: May 21, 1991

[54] CONNECTING APPARATUS

[75] Inventors: Hiroki Tsuji; Kyoichiro Kawano; Teruo Murase, all of Yokohama, Japan

[73] Assignee: Fujitsu Limited, Kawasaki, Japan

[21] Appl. No.: 483,170

[22] Filed: Feb. 22, 1990

[30] Foreign Application Priority Data

Feb. 28, 1989 [JP] Japan .............................. 1-021289[U]
Mar. 7, 1989 [JP] Japan .................................. 1-066814

[51] Int. Cl.⁵ .............................................. H01R 4/00
[52] U.S. Cl. .................................. 174/94 R; 174/260; 174/261; 228/198; 361/404; 428/642; 439/886
[58] Field of Search ............. 174/94 R, 260; 439/886, 439/931; 361/404, 405, 406; 228/198, 115, 116; 428/642, 941

[56] References Cited

U.S. PATENT DOCUMENTS 3,622,944 11/1971 Tsuchiya ......................... 439/886 X
4,538,876 9/1985 Hall et al. ......................... 439/894 X Primary Examiner—Morris H. Nimmo
Attorney, Agent, or Firm—Armstrong, Nikaido, Marmelstein, Kubovcik & Murray

[57] ABSTRACT

A connecting apparatus wherein a porous silver plating layers are provided on surface pads of a printed circuit board and on a surface of a contact provided on the pads of a mother board. The plating layers are respectively impregnated with tin-zinc alloy and gallium. The electrical connection is established between the pads of the printed circuit board and the pads of the mother board through a liquid alloy by placing the plating layers in contact with each other. For the first printed circuit board having the pads and spacer, the gallium particles are adhered to the pads, while solder is temporarily adhered to the spacer. For the second printed circuit board having the pads and the connecting pads, tin or indium layer is provided on the surface of the pads, then the spacer of the first printed circuit board is positioned and fixed to the connecting pad of the second printed circuit board. Thus, electrical connection can be formed by way of the contact of gallium-tin or gallium-indium liquid alloy between the pads of both the printed circuit boards.

7 Claims, 4 Drawing Sheets

CONNECTING APPARATUS

BACKGROUND OF THE INVENTION

1. Field of the Invention

The present invention relates to an electrical connector device.

Recent progress in requiring higher performance for computer systems includes the printed circuit boards used in these computer systems to be reduced in size and to have a high packing density.

Consistent with this recent progress, many input/output (I/O) pins are being implanted on one printed circuit board. However, attempts in connecting large amounts of I/O pins on the circuit board by using conventional male-female connectors for electrically connecting these printed circuit boards require a large amount of force on the printed circuit board. As a result, a large amount of force is applied on the printed circuit board when the male connector is fitted resulting in problems, such as, the printed circuit board being warped or in some cases, the printed circuit board being altogether broken.

Moreover, electronic parts, such as semiconductor elements, have been mounted on the printed circuit board in the form of bare chips. However, the printed circuit board having the electronic elements mounted thereon is generally formed of ceramic materials. The pads provided at predetermined regions of a bare chip of an electronic part are connected by solder with the pads provided at predetermined regions of the ceramic circuit board, but the difference of expansion coefficients between the ceramic substrate and the bare chip is large. Thus, when a bare chip is loaded or mounted on the printed circuit board, mechanical stress is generated at the junction area between the electronic parts and the printed circuit board due to temperature change at the time the power is turned ON and OFF, thereby cracks are sometimes generated at the soldered junction area.

2. Description of the Relevant Art

Attempts have been made in order to resolve the abovediscussed problems by using liquid metal for the contact area. This method is, for example, disclosed in the following patents: (1) Japanese Laid-Open Patent No. 52-73392 by H. Tsuji and K. Kawano; (2) Japanese Laid-open Patent No. 60-253177 by M. Yasunaga and K. Sato; and (3) Japanese Laid-open Patent No. 58-130540 by H. Doi et al.

In the Japanese Laid-Open Patent No. 52-73392, the contact (i.e., the junction area) is formed by a flexible material impregnated with liquid metal and the male-female connector is connected through this contact area.

In Japanese Laid-open Patent No. 60-253177, a solid metal is heated and converted to liquid metal, and electrical connection is formed by inserting electrodes to the liquid metal.

However, the metal used for the contact in Japanese Laid-Open Patent No. 52-73392 is always liquid, and the liquid metal splashes and is disabled while the terminal is repeatedly fitted and removed. In Japanese Laid-open Patent No. 60-253177, there is the disadvantage of having the liquid metal splash and consumed, like in Japanese Laid-Open Patent No. 52-73392, due to fitting and removal of electrodes. A heating apparatus is further required for melting the solid metal.

In the Japanese Laid-open Patent No. 58-130540, balls of liquid metal or liquid alloy are, under room temperature, adhered to a plurality of first pads provided at the predetermined surfaces of the electronic parts in the mounting of the electronic parts on the printed circuit board, and the first pads are positioned so that these balls match a plurality of second pads provided on the mounting surface of the printed circuit board. However, the procedural steps in forming many liquid balls and adhering these balls to the first pads cannot be easily done.

Accordingly, a conventional electrical connector cannot ensure reliable connection and the resulting efficiency for the mounting operation is low.

SUMMARY OF THE INVENTION

It is an object of the present invention to provide a highly reliable electrical connector.

It is another object of the present invention to provide an electrical connector which ensures high mounting efficiency.

The aforementioned and other objects of the present invention can be accomplished by the following descriptions hereinafter described.

One connecting object for an electrical connection is provided with a connecting pad, while another connecting object is provided with a contact having a spring means. A porous metal layer is respectively formed on each end face of a connecting pad and the contact. These porous metal layers are respectively impregnated with two kinds of metals which may generate a eutectic mixture. These two kinds of metals are generally of solid types at room temperature (25° C.). However, when these metals are in contact, these metals mutually diffuse and form an alloy, thereby generating or forming a eutectic mixture. If two kinds of metals are selected so that the eutectic point (i.e., the temperature at which the eutectic mixture is produced) is 20° C. or less, the liquid portion under room temperature may be generated at the contact portions of such metals. Thus, since two kinds of metals are respectively impregnated into porous metal layers, diffusion and melting of the two kinds of metals are generated only in the region near the contact areas of the two types of metals. In the above-described method, excessive force is unnecessary because electrical connection is established only by placing in contact the connecting pad and contact. In addition, since only a little amount of liquid alloy exists at the junction area which establishes the electrical connection, the metal impregnated into the porous metal layer is recovered almost to the condition before contact for each separated connecting pad and contact making up the electrical connection. Therefore, the metal is not consumed and can be used for a long period of time.

Summarily, the pad of one connecting object for electrical connection of this invention is provided with a fixed solid metal member under the room temperature, while the pad of another connecting object of the electrical connection is provided with a metal layer which forms a eutectic alloy in cooperation with the metal member of the pad of the first described connecting object. When these two kinds of metals are in contact, the metal layer melts into the metal member forming an alloy, thereby, the liquid alloy, under room temperature, may be formed at the junction area.

In the above-described method, it is easy to fix the metal member to the pad of the one connecting object since it is of a solid type under room temperature, and the liquid metal is generated at the contact area when these two connecting objects are placed in contact with each other. Therefore, the efficiency of the manufacturing of the electrical connector of this invention is significantly improved in comparison with the efficiency in manufacturing the conventional connector.

DESCRIPTION OF THE PREFERRED EMBODIMENTS

First Embodiment

Figure 1:
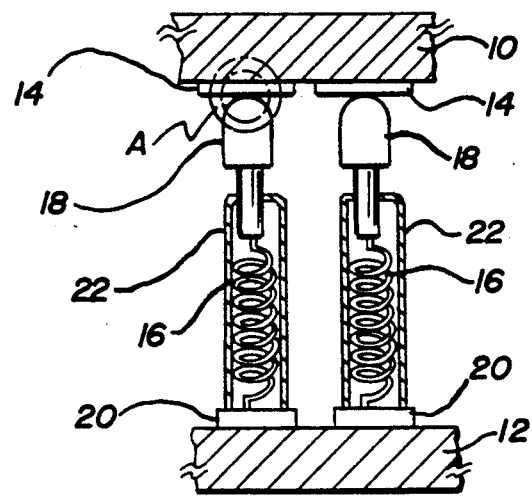
FIG. 1 is a schematic sectional view of a connecting apparatus for an electrical connection of this invention.

FIGS. 1 to FIG. 5 illustrate the first embodiment of this invention, and similar reference numerals used therein indicate similarly materials and elements.

FIG. 1 is a schematic sectional view of the connecting apparatus which establishes electrical connection. The connecting apparatus shown in this FIG. 1 has the electrical connections of the printed circuit boards 10, 12 being provided in locations opposed to each other. One printed circuit board 10 may be a daughter board for mounting thereon many large-scale integrators (LSIs), while the other printed circuit board 12 may be a mother board for mounting thereon a plurality of daughter boards. The printed circuit board 10 is provided with a connecting pad 14 and the printed circuit board 12 is provided with a pad 20 having electrical conductivity at the location opposed to the connecting pad 14. Moreover, a coil spring 16 having electrical conductivity and a small spring constant is provided on the pad 20, and a contact 18 having electrical conductivity is also provided to the coil spring 16 in contact with the connecting pad 14. The coil spring 16 is accommodated within a cylindrical capsule 22 and can be expanded or compressed in the longitudinal direction of the capsule 22. The coil spring 16 causes the contact 18 to be in contact with the connecting pad 14.

Figures 2, 3:
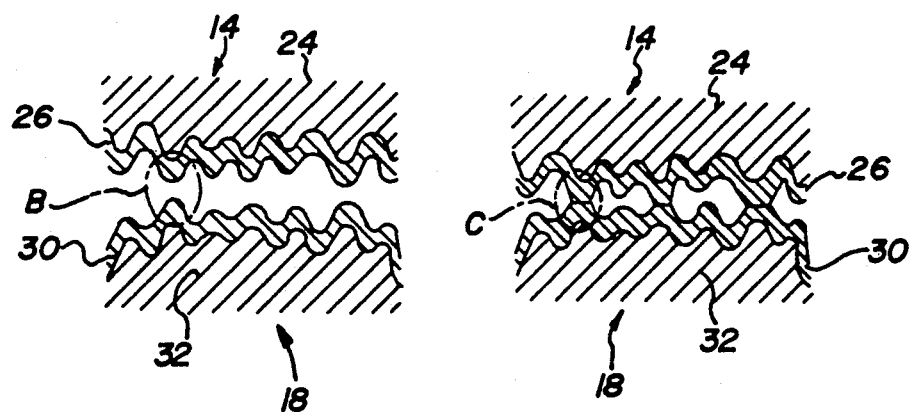
FIG. 2 is a schematic enlarged view of part A shown in FIG. 1 of a contact area of the connecting pad and contact in a separated condition.
FIG. 3 is a schematic enlarged view of a part A shown in FIG. 1 of a contact area of the connecting pad and contact in the contact condition.

FIGS. 2 and 3 are enlarged schematic views of the contact area A between the contact 18 and connecting pad 14 in FIG. 1. FIG. 2 is an enlarged schematic view of a part of the connecting pad and contact shown as being separated from each other. The connecting pad 14 is formed by coating the surface of copper (Cu) as the base material 24 with the porous silver plating layer 26. The contact 18 is formed by coating the surface of copper as the base material 32 with the porous silver plating layer 30. These porous silver plating layer may be formed by, for example, large current electroplating. FIG. 3 is an enlarged schematic view of a part of the contact area A between the connecting pad and the contact under a contact condition. The contact condition is attained at a partial area of both porous silver plating layer 26 and the porous silver plating area 30.

Figure 5:
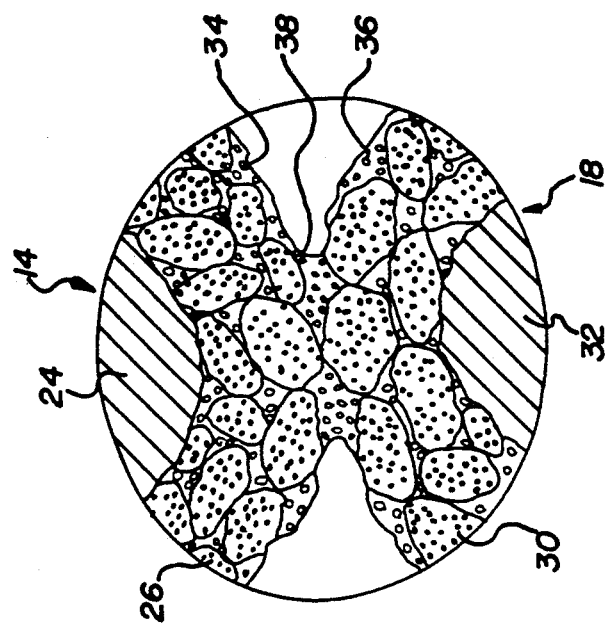
FIG. 5 is a schematic enlarged view of part C shown in FIG. 2.
Figure 4:
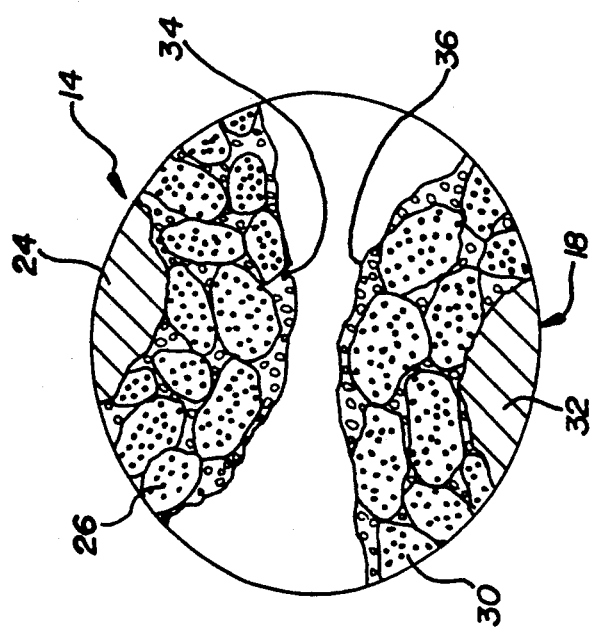
FIG. 4 is a schematic enlarged view of part B shown in FIG. 2.

The enlarged schematic view of the area B in FIG. 2 is shown in FIG. 4. The enlarged schematic view of the area C in FIG. 2 is shown in FIG. 5. FIG. 4 is a schematic diagram of the structures of the porous silver plating layer 26 and the porous silver plating layer 30.

The tin-zinc alloy (Sn-Zn alloy) 34 is impregnated into the porous silver plating layer 26, while gallium 36 is impregnated into the porous silver plating layer 30.

When the connecting pad 14 and contact 18 are placed in contact with each other, as shown in FIG. 5, the tin-zinc alloy 34 and gallium impregnated, respectively, to the porous silver plating layers 26, 30 in the area near the contact area diffuse with each other resulting in an alloy 38 having a melting point of about 10° C. being generated.

However, since the silver plating layers 26, 30 are porous, mutual diffusion of tin-zinc alloy 34 and gallium 36 in the area other than an area near the contact area is interfered with, and the alloy 38 with the melting point of about 10° C. is no longer generated. In other words, a substantial portion of the impregnated metal in the respective silver plating layers remains.

Therefore, in this embodiment of this invention, the contact of connecting pad 14 and contact 18 is accomplished with a contact derived from very little amount of liquid alloy.

In the case where the connected connecting pad 14 and contact 18 are to be separated from each other, since the volume of alloy 38 is very small in comparison with the volume of the impregnated metal, the tin-zinc alloy in the alloy 38 diffuses to the gallium 36 at the side of contact 18, while gallium diffuses into the tin-zinc alloy 34 at the side of connecting pad 14. As a result, the liquid alloy disappears. Consequently, the tin-zinc alloy 34 and gallium 36 which have been impregnated into the silver plating layers 26, 30, respectively, return to almost the same condition before the contact between the connecting pad 14 and contact 18 was separated.

As described above, this embodiment of this invention discloses a connecting apparatus which is especially effective for, for example, providing the electrical connection between the printed circuit board and the mother board, which often requires connection and disconnection.

In addition, silver plating layer is used as the porous layer in this embodiment, but metals such as nickel (Ni) or palladium (Pd) which does not easily generate an alloy with a low melting point metal, such as gallium, may be used. As with metal having a low melting point, a combination of metal having low melting points, such as gallium-indium and gallium-indium-tin alloy, may also be used.

Moreover, in this embodiment of this invention, the contact 18 is placed in contact with the connecting pad 14 by the spring 16. However, any kind of device or structural arrangement may also be employed so long as the employed device can place the contact 18 in contact with the connecting pad 14. It is further noted that the printed circuit boards 10, 12 are mechanically coupled at the end portions thereof.

Second Embodiment

Unlike the first embodiment, this embodiment of this invention is effectively applied to the structure which does not disconnect the electrical connection once the desired electrical connection has been achieved.

Figure 6A:
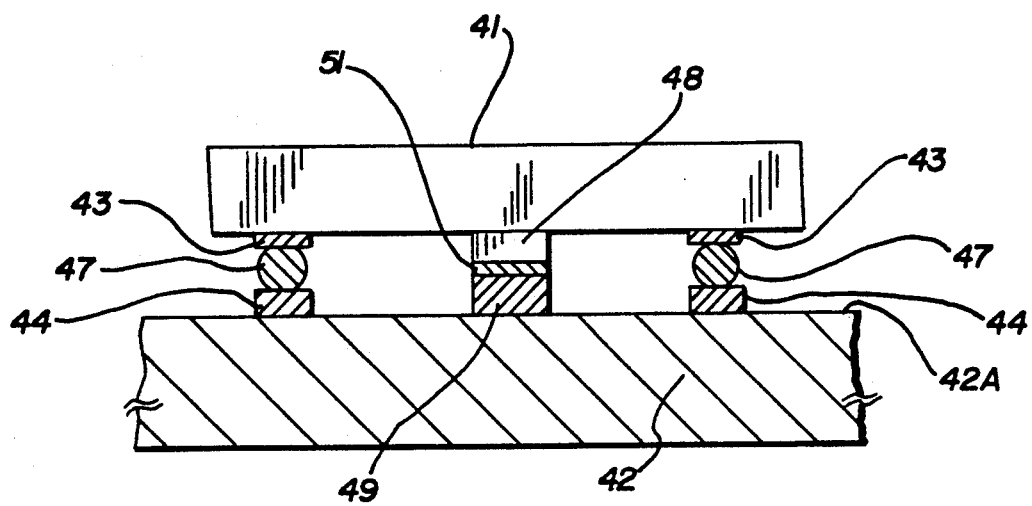
FIG. 6(a) is a schematic diagram of electronic parts mounted on the printed circuit board.

FIG. 6(a) is a schematic diagram of the structure whereby electronic elements are mounted on the printed circuit board 42. The liquid alloy forms contact 47. The contact 47 is generated through a process whereby the metal member 45 fixed to the first pad 43 of electronic part 41, and the metal layer 46 stacked to the second pad 44 of the printed circuit board 42 are placed in contact with each other, thereby converting the alloy.

In addition, the spacer 48 is provided at a predetermined area of the electronic part 41, and the connecting pad 49 on the printed circuit board 42. The spacer 48 and connecting pad 49 are connected by solder 51, thereby, positioning the first pad 43 and the second pad 44.

The mounting processes for forming the electrical connector shown in FIG. 6(a) is hereinafter explained.

Figure 6B:
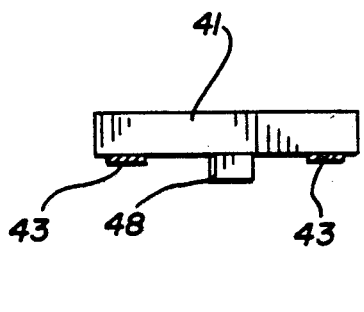
FIG. 6(b) is a schematic diagram illustrating the mounting step for providing pads of electronic parts and spacers adjacent to the pads.
Figure 6C:
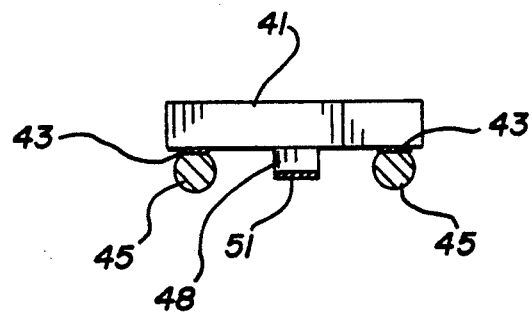
FIG. 6(c) is a schematic diagram illustrating the mounting step for fixing a metal member to the pad of the electronic part and for fixing a solder to the spacer by temporary soldering.

First, as shown in FIG. 6(b), the spacer 48 is provided adjacent to the first pad 43 of the electronic part 41 to be mounted. Then, as shown in FIG. 6(c), a predetermined amount of metal member 45, such as gallium, is fixed to the first pad 43, and solder 51 is fixed to the spacer 48 by temporary soldering. In the case where gallium is used as the metal member 45, the metal member 45 can be easily handled since gallium is in the solid state at 25° C. Moreover, gallium can be fixed to the first pad 43 through the application of a little amount of heat.

Figure 6D:
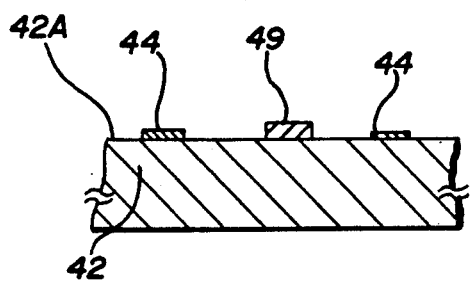
FIG. 6(d) is a schematic diagram illustrating the mounting step for providing a connecting pad which matches with the spacer of the electronic part at the mounting surface wherein the pads of the printed circuit board are arranged.

As shown in FIG. 6(d), the printed circuit board 42 is provided with the connecting pad 49 for matching with the spacer 48 of the electronic part 41 at the mounting surface 42A of the printed circuit board on which a second pad 44 is arranged.

Figure 6E:
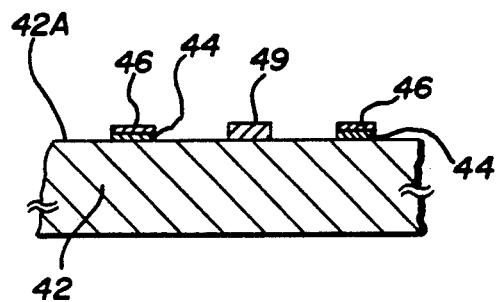
FIG. 6(e) is a schematic diagram illustrating the mounting step for forming a metal layer, which generates an alloy with a metal member fixed to the pad of the electronic part, to the pad of the printed circuit board.

As shown in FIG. 6(e), a metal layer 46, which generates an alloy with a metal member 45, is formed on the second pad 44 by a well known method, such as, evaporation. In the case where the metal member 45 is formed by gallium, it is preferable to form the metal layer 46 with tin or indium.

Figure 6F:
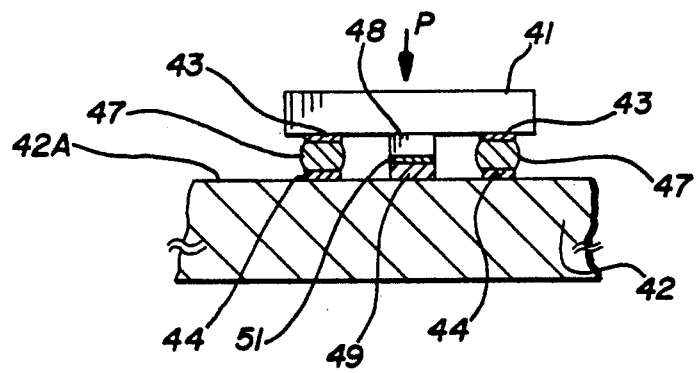
FIG. 6(f) is a schematic diagram showing the step for completing the mounting of the electronic parts to the mounting surface of the printed circuit board, making the positioning by matching the spacer to the connecting pad, and then pressing the electronic parts to the printed circuit board with a predetermined pressure.

Next, as shown in FIG. 6(f), after the electronic part 41 is mounted on the mounting surface 42A of the printed circuit board 42 and positioning is carried out by providing the spacer 48, matching with the connecting pad 49, the electronic part 41 is subsequently pressed with a predetermined pressure p to the printed circuit board 42, and a sufficient amount of heat is applied thereto. Thus, the metal layer 46 melts into the metal member 45, thereby, forming an alloy 47. The generated alloy 47, having a melting point which is lower than the melting points of the metal member 45 and metal layer 46, is in the liquid condition at room temperature (25° C.).

Accordingly, the contact 47 is formed by the liquid alloy at room temperature (25° C.) between the first pad 43 and the second pad 44. The contact 47 establishes electrical connection between the first pad 43 and second pad 44, while the spacer 48 is fixed to the connecting pad 49 by the solder 51. In the case where gallium is used for the metal member 45, and tin is used for the metal layer 46, the melting point of the generated alloy contact 47 of gallium-tin is about 20°0 C. On the other hand, in the case where gallium is used for the metal member 45, and indium is used for the metal layer 46, the melting point of the generated alloy of gallium-tin is also about 20° C.

As discussed above, an electronic part 41 forming the electrical connection at the contact 47 of liquid alloy, between the first pad 43 and the second pad 44, is supported on the printed circuit board by the spacer 48 fixed to the connecting pad 49.

In the above-described case, no stress is generated at the contact 47 due to temperature change between the power ON and power OFF conditions of the electronic part. Moreover, since the spacer 48 is substantially provided at a center portion of the electronic part, stresses are cancelled during both periods of expansion and compression, thereby, eliminating any substantial stress which may be generated at the contact formed by the solder 51.

While the invention has been particularly shown and described in reference to preferred embodiments thereof, it will be understood by those skilled in the art that changes in form and details may be made therein without departing from the spirit and scope of the invention.

What is claimed is:

1. A connecting apparatus for electrically connecting a first object and a second object, said first object and second object being opposed to each other, said connecting apparatus, comprising:

a first metal having a first melting point provided on said first object;

a second metal having a second melting point provided on said second object, wherein said second metal, when in contact with said first metal, generates an alloy having a third melting point solely at contact points of said first and second metals, and wherein said third melting point is lower than said first and second melting points;

a first porous metal layer impregnated with said first metal; and a second porous metal layer, opposed to said first porous metal layer, impregnated with said second metal, wherein said first and second metal layers are selected from the group consisting of silver, nickel and palladium.

2. The connecting apparatus according to claim 1, further comprising:

a plurality of first pads provided on said first object for mounting said first metal on said first pads; and a plurality of second pads provided on said second object corresponding to said first pads for mounting said second metal on said second pads, an electrical connection being established between corresponding first and second pads.

3. The connecting apparatus according to claim 2, further comprising a spring means provided on said second pads for causing said second metal to be in contact with said first metal.

4. The connecting apparatus according to claims 1, 2 or 3, wherein said second metal impregnated into said second porous metal layer is selected from the group, being of low melting point metals, consisting of gallium, gallium-indium alloy, gallium-indium-tin, and wherein said first metal impregnated into said first porous metal layer is tin-zinc alloy.

5. The connecting apparatus according to claim 1, wherein said first and second metals are in the solid state at room temperature, and wherein said alloy generated when said second metal is placed in contact with said first metal is in the liquid state at room temperature.

6. The connecting apparatus according to claims 2 or 5, wherein said first metal provided on said first pads is gallium, and wherein said second metal provided on said second pads is selected from the group consisting of indium and tin.

7. The connecting apparatus according to claim 2, further comprising:
a connecting pad provided at a predetermined position on said second object; and
a spacer provided at a predetermined position on said first object, said spacer being positioned and fixed on said connecting pad when said first object and said second object become connected.

* * * * *

UNITED STATES PATENT AND TRADEMARK OFFICE
CERTIFICATE OF CORRECTION

PATENT NO. : 5,017,738
DATED : May 21, 1991
INVENTOR(S) : Hiroki TSUJI et al

It is certified that error appears in the above-identified patent and that said Letters Patent is hereby corrected as shown below:

On the cover page, Item [30], "Mar. 7, 1989" should read -- Mar. 17, 1989 --.

Signed and Sealed this

Fifteenth Day of December, 1992

Attest:

DOUGLAS B. COMER

Attesting Officer

Acting Commissioner of Patents and Trademarks